US008758912B2

(12) United States Patent
Srinivasan et al.

(10) Patent No.: US 8,758,912 B2
(45) Date of Patent: Jun. 24, 2014

(54) INTERLAYERS FOR MAGNETIC RECORDING MEDIA

(75) Inventors: Kumar Srinivasan, San Mateo, CA (US); B. Ramamurthy Acharya, Fremont, CA (US)

(73) Assignee: WD Media, LLC, San Jose, CA (US)

(*) Notice: Subject to any disclaimer, the term of this patent is extended or adjusted under 35 U.S.C. 154(b) by 216 days.

(21) Appl. No.: 13/234,399

(22) Filed: Sep. 16, 2011

(65) Prior Publication Data

US 2013/0071694 A1    Mar. 21, 2013

(51) Int. Cl.
    *G11B 5/66* (2006.01)
(52) U.S. Cl.
    USPC .................................. 428/831; 204/192.1
(58) Field of Classification Search
    None
    See application file for complete search history.

(56) References Cited

U.S. PATENT DOCUMENTS

| 7,067,206 B2 | 6/2006 | Uwazumi et al. |
| 7,247,396 B2 | 7/2007 | Nolan et al. |
| 7,592,080 B2 | 9/2009 | Takenoiri et al. |
| 7,807,278 B2 | 10/2010 | Sugimoto et al. |
| 7,833,640 B2 | 11/2010 | Marinero et al. |
| 2002/0058160 A1 | 5/2002 | Oikawa et al. |
| 2004/0053073 A1 | 3/2004 | Lu et al. |
| 2005/0064243 A1* | 3/2005 | Moriwaki et al. ...... 428/694 TR |
| 2006/0051620 A1* | 3/2006 | Hinoue et al. ............. 428/828.1 |
| 2006/0057431 A1* | 3/2006 | Tamai et al. ............... 428/836.2 |
| 2008/0166596 A1 | 7/2008 | Das et al. |
| 2009/0015967 A1 | 1/2009 | Kuboki |
| 2010/0173175 A1* | 7/2010 | Takahashi et al. ............ 428/810 |
| 2011/0143169 A1* | 6/2011 | Albrecht et al. .............. 428/846 |

* cited by examiner

*Primary Examiner* — Holly Rickman

(57) ABSTRACT

Embodiments of the present invention include a recording medium comprising: a hard magnetic recording layer and an interlayer disposed under the hard magnetic recording layer, wherein the interlayer comprises an upper layer of Ru-based alloy and a lower layer of RuCo or ReCo alloy. Generally for embodiments of the present invention, the lower layer of RuCo or ReCo alloy is formed over a seed layer using a low-pressure sputter process, and the upper layer of Ru-based alloy is formed over the lower layer using a high-pressure sputter process.

16 Claims, 9 Drawing Sheets

| Disk | ReCo thickness, nm | Ru thickness, nm | Hc Oe | Hn Oe | Hs Oe | KuV/kT | MTW 2T uin | OW2 dB | wsSNR$_{init}$ dB | wsSNR$_{final}$ dB |
|---|---|---|---|---|---|---|---|---|---|---|
| B1 | 0 | 15.1nm | 4946 | -2004 | 7996 | 92 | 3.03 | 33.6 | 12.7 | 9.7 |
| B2 | 14.4nm | 0 | 4906 | -2072 | 7808 | 104 | 3.19 | 41.0 | 12.3 | 8.3 |
| B3 | 14.4 (LP) | 4.9 (HP) | 5163 | -2326 | 8159 | 105 | 3.01 | 36.3 | 12.6 | 10.6 |
| B4 | 14.4 (LP) | 7.4 (HP) | 5208 | -2229 | 8402 | 103 | 3.06 | 37.3 | 12.8 | 10.5 |
| B5 | 10.8 (LP) | 4.9 (HP) | 5096 | -2298 | 8063 | 102 | 3.09 | 37.3 | 12.6 | 9.7 |
| B6 | 10.8 (LP) | 7.4 (HP) | 5190 | -2229 | 8327 | 97 | 3.07 | 38.2 | 12.8 | 10.4 |
| B7 | 10.8 (LP) | 9.8 (HP) | 5110 | -2059 | 8330 | 99 | 3.02 | 36.3 | 12.9 | 10.5 |

| Disk | Ru40Co thickness, nm | Ru thickness, nm | Hc Oe | Hn Oe | Hs Oe | KuV-kT | MTW 2T uin | OW2 dB | wsSNR$_{init}$ dB | wsSNR$_{final}$ dB |
|---|---|---|---|---|---|---|---|---|---|---|
| C1 | OFF | 15nm | 5246 | -2110 | 8483 | 99 | 2.90 | 28.7 | 12.6 | 10.3 |
| C2 | 15nm | OFF | 4876 | -1810 | 7852 | 139 | 3.47 | 43.6 | 11.0 | 4.5 |
| C3 | 10LP | 5HP | 5576 | -2563 | 8737 | 149 | 2.95 | 34.0 | 12.1 | 10.0 |
| C4 | 10LP | 10HP | 5588 | -2328 | 9062 | 139 | 2.90 | 32.7 | 12.5 | 10.3 |
| C5 | 7.5LP | 7.5HP | 5487 | -2272 | 8851 | 135 | 3.07 | 36.5 | 12.5 | 9.8 |
| C6 | 7.5LP | 10HP | 5516 | -2280 | 8957 | 139 | 2.92 | 34.1 | 12.6 | 10.4 |
| C7 | 7.5LP | 12.5HP | 5572 | -2288 | 9070 | 139 | 2.96 | 32.0 | 12.6 | 10.6 |
| C8 | 5LP | 10HP | 5444 | -2175 | 8861 | 128 | 3.02 | 34.8 | 12.6 | 10.0 |
| C9 | 5LP | 12.5HP | 5474 | -2199 | 8921 | 136 | 3.02 | 32.2 | 12.6 | 10.4 |
| C10 | 5LP | 15HP | 5510 | -2223 | 9001 | 136 | 2.97 | 31.5 | 12.7 | 10.6 |

FIG. 7

INTERLAYERS FOR MAGNETIC RECORDING MEDIA

TECHNICAL FIELD

This invention relates to the field of disk drives and more specifically, to magnetic recording media for disk drives.

BACKGROUND

For all types of substrates, magnetic recording media has begun to incorporate perpendicular magnetic recording (PMR) technology in an effort to increase areal density and is now working toward densities of 800 Gbits/in$^2$. Generally, PMR media may be partitioned into two primary functional regions: a soft magnetic underlayer (SUL) and a magnetic recording layer(s) (RL). FIG. 1 illustrates portions of a conventional perpendicular magnetic recording disk drive system having a recording head 101 including a trailing write pole 102 and a leading return (opposing) pole 103 magnetically coupled to the write pole 102. An electrically conductive magnetizing coil 104 surrounds the yoke of the write pole 102. The bottom of the opposing pole 103 has a surface area greatly exceeding the surface area of the tip of the write pole 102. As the magnetic recording disk 105 is rotated past the recording head 101, current is passed through the coil 104 to create magnetic flux within the write pole 102. The magnetic flux passes from the write pole 102, through the disk 105, and across to the opposing pole 103 to record in the PMR layer 150. The SUL 110 enables the magnetic flux from the trailing write pole 102 to return to the leading opposing pole 103 with low impedance.

Typically, higher areal densities are typically achieved with well-isolated smaller grains in the PMR layer. A higher magnetocrystalline anisotropy constant ($K_u$) is typically required to resist the demagnetization effects of the perpendicular geometry and to keep the smaller grains thermally stable to reduce media noise. For example, smaller grain size (<7 nm) and high magnetocrystalline anisotropy ($K_u$) L1$_0$ ordered FePt media can achieve areal density beyond 1 Tb/in$^2$ magnetic recording.

As such, some PMR media use antiferromagnetically-coupled soft magnetic underlayers (SULs), Ta seed layer and Ru intermediate layers to induce favorable crystallographic texture, define grain size and to produce a distinctive microstructure comprising isolated magnetic grains in a nonmagnetic matrix. To further assist with these desirable properties, some PMR media also use a Cr, CrTi or CrTa adhesion layer between the substrate and SUL, and a NiW-based orientation layer NiW, NiWAl, NiWAlFe) under the seed layer.

FIG. 2 illustrates a cross-sectional view of an exemplary PMR media comprising a bottom substrate 203, an adhesion layer 206, a SUL 209, an orientation interlayer 212, a seed layer 215, an intermediate layer 218, and a magnetic recording layer 221.

Enhanced write head fields and gradients are desirable in PMR media because (a) they help in writing data on the PMR media with higher switching fields, and (b) they help in overwriting previously written data on the PMR media. The writability for PMR media is traditionally measured in terms of reverse overwrite (referred to as OW or OW2), which is a recording parameter measured in decibels (dB).

Generally, a SUL (e.g., 215) provides a closure path for the magnetic flux from the magnetic write head to the PMR media during data writing processes, and provides the PMR media with sharp head field gradients and large head fields. Unfortunately, the intermediate and seed layers (e.g., 212 and 215 respectively) are typically non-magnetic (e.g., NiW and Ru, respectively) and as a consequence, diverge the write head flux leading to decreased write head fields and gradients. As such, to further enhance write head fields and gradients, some PMR media use NiWFe-based seed layers to improve media overwrite. NiWFe is magnetic and known to help pass the flux from the write head onto the SUL.

BRIEF DESCRIPTION OF THE DRAWINGS

The present invention is illustrated by way of example, and not limitation, in the figures of the accompanying drawings in which:

FIG. 4 provides a table relating to magnetic and recording properties of example embodiments of the present invention versus an example conventional medium and a test medium;

FIG. 7 provides a table relating to magnetic and recording properties of example embodiments of the present invention versus an example conventional medium and a test medium;

DETAILED DESCRIPTION

In the following description, numerous specific details are set forth, such as examples of specific layer compositions and properties, to provide a thorough understanding of various embodiment of the present invention. It will be apparent however, to one skilled in the art that these specific details need not be employed to practice various embodiments of the present invention. In other instances, well known components or methods have not been described in detail to avoid unnecessarily obscuring various embodiments of the present invention.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Embodiments of the present invention include a recording medium comprising: a hard magnetic recording layer and an interlayer disposed under the hard magnetic recording layer, wherein the interlayer comprises an upper layer of Ru-based alloy and a lower layer of RuCo or ReCo alloy. Generally for embodiments of the present invention, the lower layer of RuCo or ReCo alloy is formed over a seed layer using a low-pressure sputter process, and the upper layer of Ru-based alloy is formed over the lower layer using a high-pressure sputter process. In using such a dual-layer interlayer, PMR media in accordance with some embodiments exhibit improved reverse overwrite (OW2) capabilities without degrading signal-to-noise ratio (SNR) at comparable magnetic track widths (MTW), and improved thermal stability.

Figure 1:
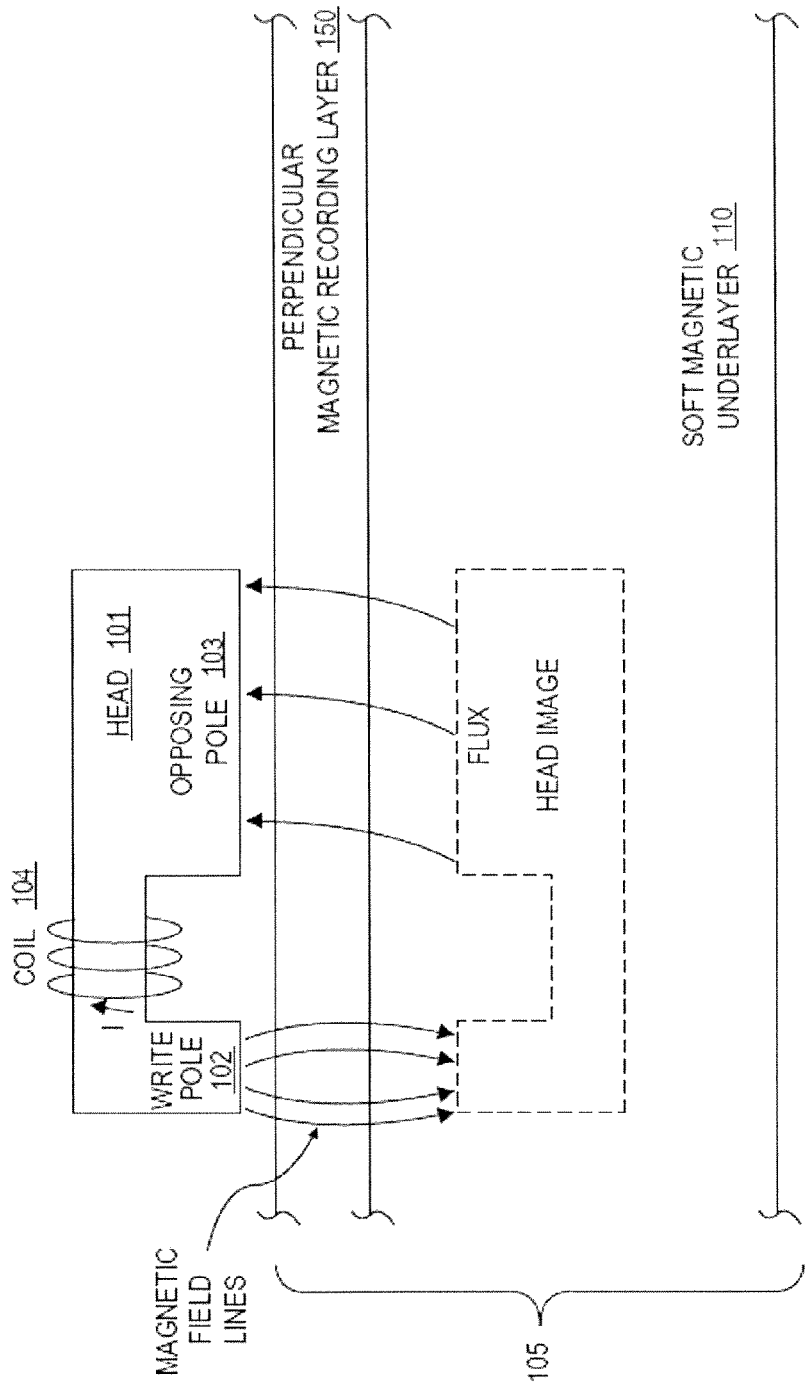
FIG. 1 (prior art) is a diagram illustrating a conventional perpendicular recording disk drive system.
Figure 2:
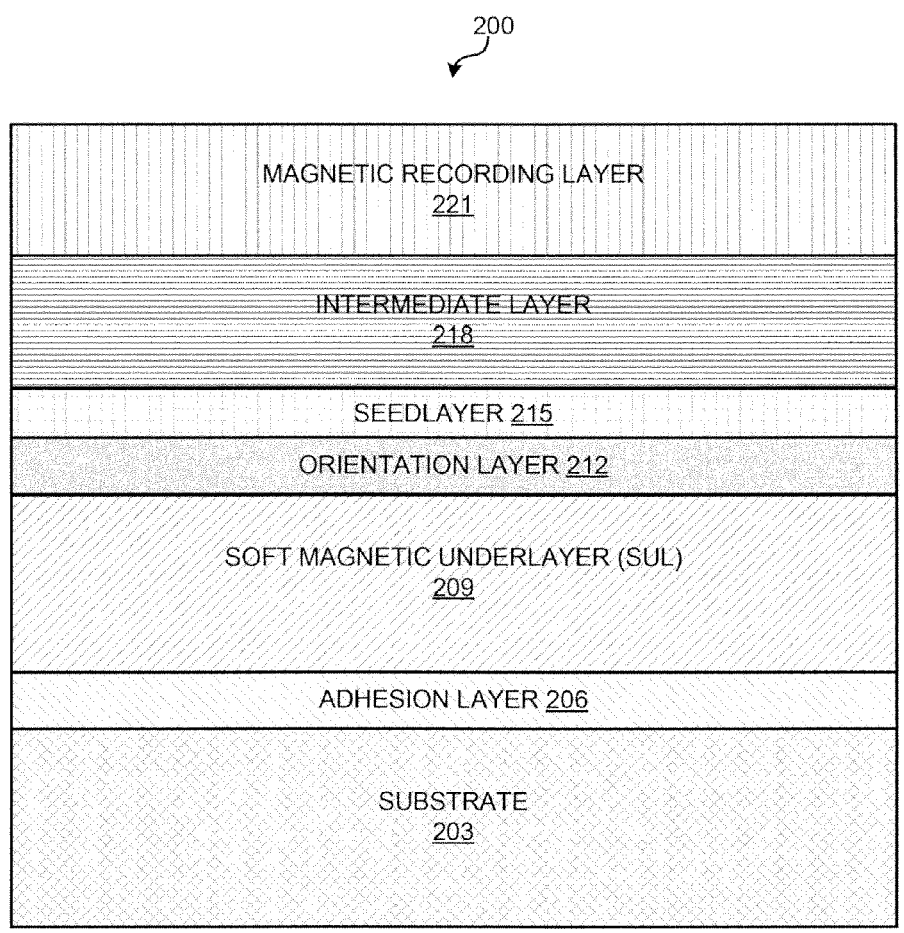
FIG. 2 (prior art) is a diagram illustrating a cross-sectional view of an exemplary perpendicular magnetic recording (PMR) media structure.
Figure 3:
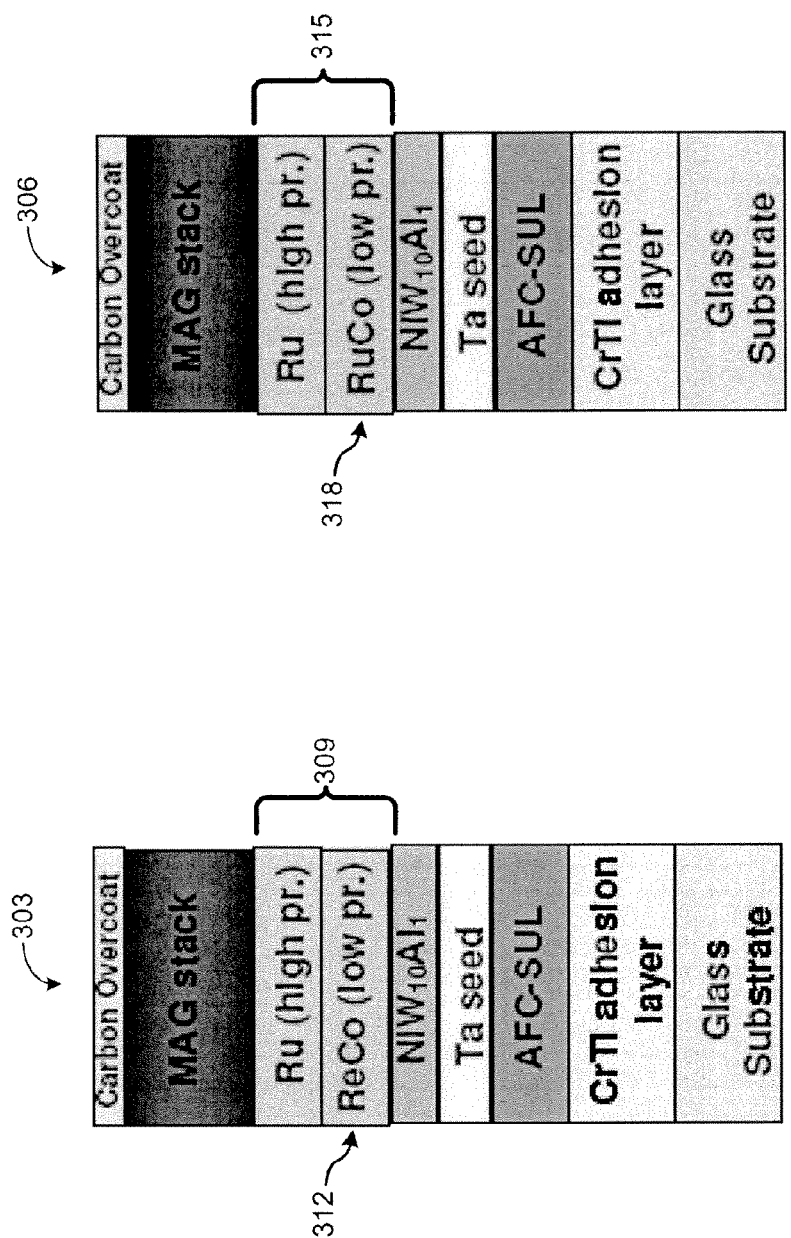
FIG. 3 is a diagram illustrating example perpendicular magnetic recording (PMR) media structures in accordance with embodiments of the present invention.

FIG. 3 is a diagram illustrating example perpendicular magnetic recording (PMR) media structures in accordance with embodiments of the present invention. Both media structures 303 and 306 depicted comprise a glass substrate, a CrTi or CrTa adhesion layer over the glass substrate, a antiferromagnetically coupled SUL, a Ta seed layer, a $NiW_{10}Al_1$ orientation layer, a magnetic stack comprising a hard magnetic recording layer, and a carbon overcoat. The media structure 303 includes an interlayer 309 comprising a lower layer of ReCo formed using low pressure/energy, and an upper layer of Ru alloy formed using high pressure/energy. In contrast, the media structure 306 includes an interlayer 315 comprising a lower layer of RuCo formed using low pressure/energy, and an upper layer of Ru alloy formed using high pressure/energy. For some embodiments, the lower layer of the interlayer is sputter deposited using Ar gas at a (low) sputter pressure of ~7 mtorr, and the upper layer of the interlayer is sputter deposited using Ar gas at a (high) sputter pressure of ~90 mtorr.

As noted herein, various embodiments of the present invention exhibit improved magnetic and recording properties over conventional media. To better illustrate some example improvements, FIG. 4 provides a table and corresponding graphs relating to magnetic and recording properties of example embodiments of the present invention versus an example conventional medium and a test medium. Turning now to FIG. 4, table 403 provides magnetic hysteresis properties such as coercivity $H_c$, nucleation field $H_n$ and saturation field $H_s$, and recording properties such as magnetic track width (MTW), reverse overwrite (OW2) and weighted-sum signal-to-noise ratio ws-SNR. Ws-SNR refers to the average signal-to-noise ratio (SNR) of a random data pattern, Ws-$SNR_{init}$ refers to the initial ws-SNR after one write, and ws-$SNR_{final}$ refers to the final ws-SNR after 500 writes on an adjacent track.

In table 403, disk B1 represents an example conventional medium having a Ru interlayer comprising: a lower layer of Ru having a thickness of 5 nm formed using low pressure; and an upper layer of Ru having a thickness of 10.1 nm and formed using high pressure. Disk B2, on the other hand, represents a test medium having a ReCo interlayer comprising: a lower layer of Re—Co having a thickness of 4.8 nm and formed using low pressure; and an upper layer of Re—Co having a thickness of 9.6 nm and formed using high pressure.

In comparison, disks B3 thru B7 represent example media in accordance with some embodiments of the invention. As illustrated in table 403, each of disks B3 thru B7 comprises an interlayer comprising a lower layer of ReCo formed using low pressure/energy, and an upper layer of Ru alloy formed using high pressure/energy. For disks B3 thru B7, the "ReCo" column indicates the thickness of the ReCo lower layer of the interlayer for each disk, and the "Ru" column indicates the thickness of the Ru upper layer for each disk. The "LP" designation indicates that a "low-pressure" sputter process was used during formation of the layer, while the "HP" designation indicates that a "high-pressure" sputter process was used during formation of the layer.

As observed in table 403, though the OW2 of disk B2 increased over that of disk B1 (i.e., from 33.6 dB to 41.0 dB) by using a single interlayer of ReCo in disk B2 in place of the single interlayer of Ru, the MTW also got wider (i.e., from 3.03 to 3.19), and both the initial ws-SNR and the final ws-SNR performance degraded (i.e., from 12.7 dB to 12.3 dB for ws-$SNR_{init}$, and from 9.7 dB to 8.3 dB for ws-SNR final). Comparing disk B2 with disks B3 thru B7, the use of a high-pressure Ru layer on top of a low-pressure ReCo in disks B3 thru B7 provides better SNR performance over disk B2, but as a tradeoff with slightly lower OW2 than disk B2. As shown also shown by table 403, in comparison to disk B1, disks B3 thru B7 observed: (a) an improved OW2 by 3-5 dB; (b) SNR performance that either matched or bettered that of disk B1 by 0.9 dB; (c) a MTW that was either matching or slightly wider than that of disk B1; and (d) an improved thermal stability (i.e. KuV/kT) by 5-13 counts. In some embodiments, the thermal stability gained may be traded-off for further improvement in performance.

Figure 5:
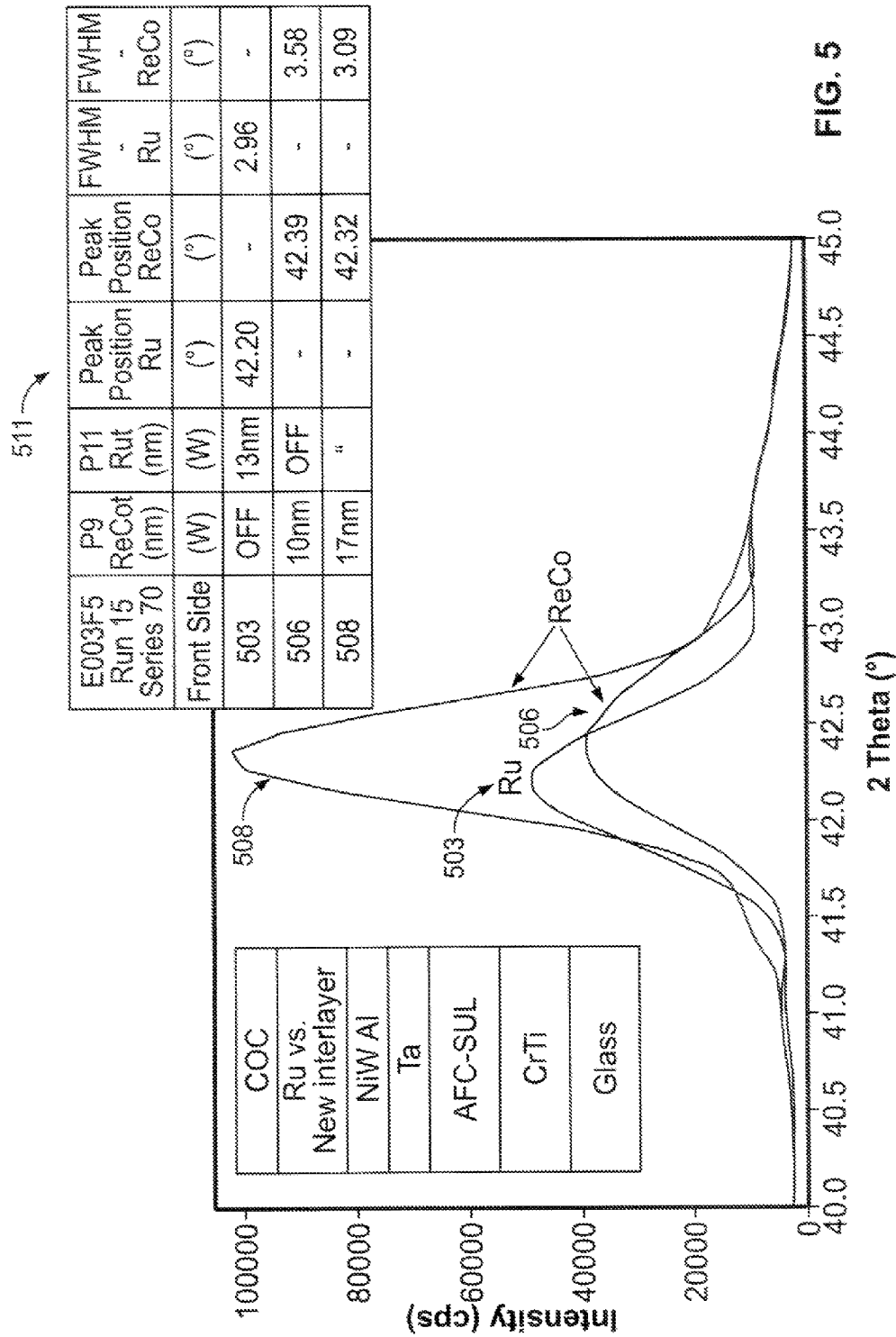
FIG. 5 is a graph illustrating the results of a X-ray diffraction (XRD) scan of an embodiment of the present invention versus the scan of a conventional medium.

FIG. 5 is a graph illustrating the results of an X-ray diffraction (XRD) scan of an embodiment of the present invention versus the scan of a conventional medium. More specifically, FIG. 5 illustrates the results of an X-ray diffraction (XRD) 2Θ scan for a convention medium comprising a 13 nm Ru interlayer 503, in comparison to media comprising a Re-50Co (i.e., Re-50 at % Co) interlayers 506 and 508 in accordance with some embodiments—the Re-50Co interlayer 506 having a thickness of 10 nm, and the Re-50Co interlayer 508 having a thickness of 17 nm. Table 511 illustrates the full-width-halfmaximum (FWHM) measured by rocking curve scans for each of the media. As shown, the FWHM for the Re-50Co interlayers 506 and 508 are slightly higher by 0.2° to 0.3° in comparison to the FWHM for the Ru interlayer.

Figure 6:
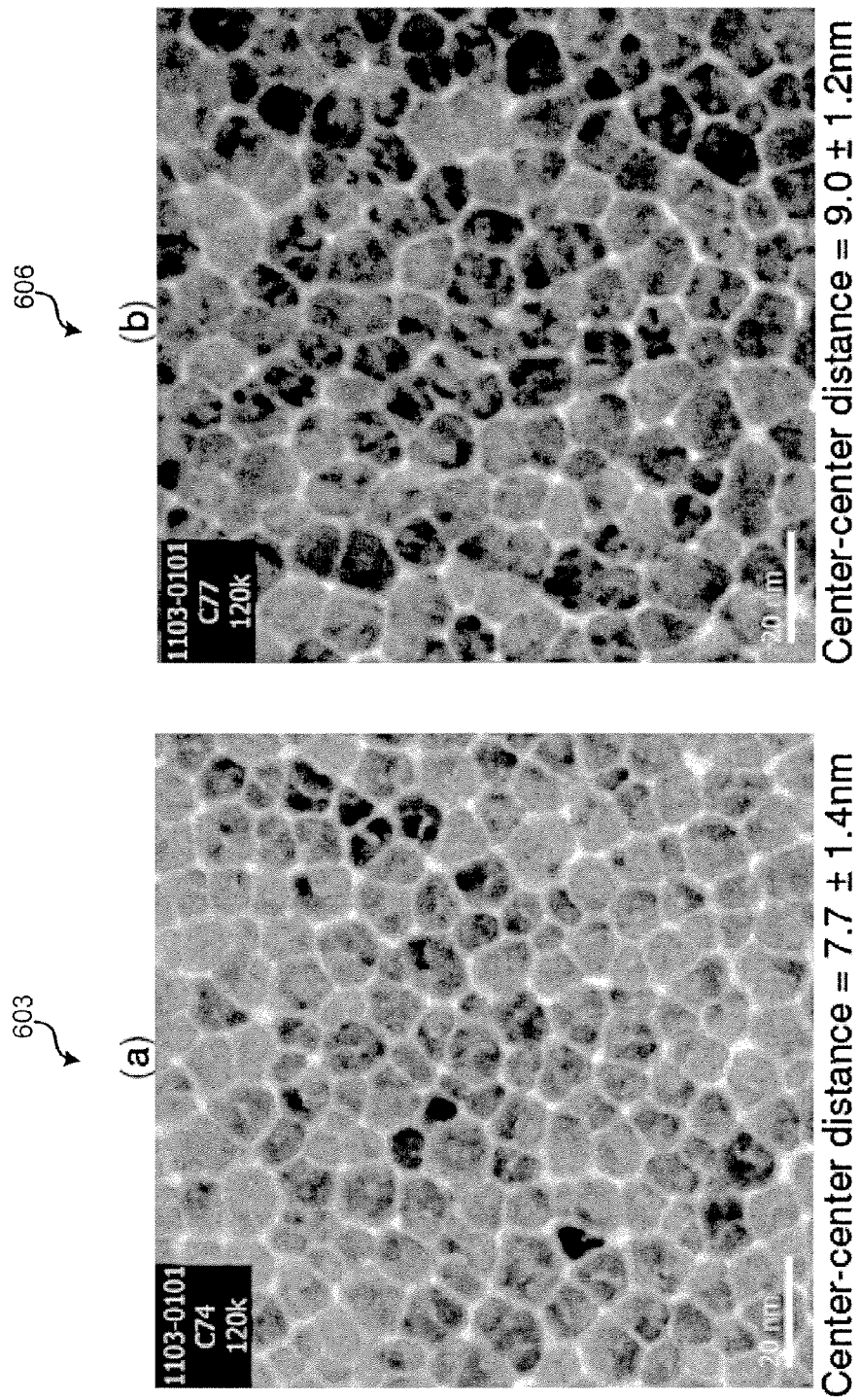
FIG. 6 are transmission electron microscope (TEM) image of an embodiment of the present invention and a TEM image of a conventional medium.

FIG. 6 are transmission electron microscope (TEM) image of an embodiment of the present invention and a TEM image of a conventional medium. The TEM image 603 is that of a conventional medium comprising a Ru interlayer formed using a dual-pressure process, and the TEM image 606 is that of a medium comprising a Re-50Co interlayer in accordance with one embodiment. As illustrated by the TEM image 603, the average center-to-center distance between grains for the conventional medium was 7.7±1.4 nm. In contrast, the TEM image 606 illustrate how the average center-to-ceenter distance between grains for the medium comprising Re-50Co interlayers was 9.0±1.2 nm.

FIG. 7 provides a table and corresponding graphs relating to magnetic and recording properties of example embodiments of the present invention versus an example conventional medium and a test medium. Turning now to FIG. 7, table 703 provides magnetic hysteresis properties similar to table 403 in FIG. 4. In table 703, disk C1 represents an example conventional medium having a Ru interlayer comprising: a lower layer of Ru having a thickness of 5 nm formed using low pressure; and an upper layer of Ru having a thickness of 10 nm and formed using high pressure. Disk C2, on the other hand, represents a test medium having a Ru-40Co (i.e., Ru-40 at % Co) interlayer comprising: a lower layer of Ru-40Co having a thickness of 5 nm formed using low pressure; and an upper layer of Ru-40Co having a thickness of 10 nm and formed using high pressure.

In comparison, disks C3 thru C10 represent example media in accordance with some embodiments of the invention. As illustrated in table 703, each of disks C3 thru C10 comprises an interlayer comprising a lower layer of RuCo formed using low pressure/energy, and an upper layer of Ru alloy formed using high pressure/energy. For disks C3 thru C10, the "Ru40Co" column indicates the thickness of the Ru-40Co lower layer of the interlayer for each disk, and the "Ru" column indicates the thickness of the Ru upper layer for each disk. The "LP" designation indicates that a "low-pressure" sputter process was used during formation of the layer, while the "HP" designation indicates that a "high-pressure" sputter process was used during formation of the layer.

As observed in table 703, though the OW2 of disk C2 increased over that of disk C1 (i.e., from 28.7 dB to 43.6 dB) by using a single interlayer of $R^{u40}Co$ in disk C2 in place of the single interlayer of Ru, the KM also got wider (i.e., from 2.9 to 3.47), and both the initial ws-SNR and the final ws-SNR performance degraded (i.e., from 12.6 dB to 11.0 dB for ws-$SNR_{init}$, and from 10.3 dB to 4.5 dB for ws-$SNR_{final}$). Comparing disk C2 with disks C3 thru C10, the use of a high-pressure Ru layer on top of a low-pressure RuCo in disks C3 thru C10 provides better SNR performance over disk C2, but as a tradeoff with slightly lower OW2 than disk C2. As shown also shown by table 703, in comparison to disk C1, disks C3 thru C10 observed: (a) an improved OW2 by 3-5 dB; (b) SNR performance that either matched or bettered that of disk C1 by 0.3 dB; (c) a MTW that was either matching or slightly wider than that of disk C1; and (d) an improved thermal stability (i.e. KuV/kT) by 40 counts. In some embodiments, the thermal stability gained may be traded-off for further improvement in performance.

Figure 8:
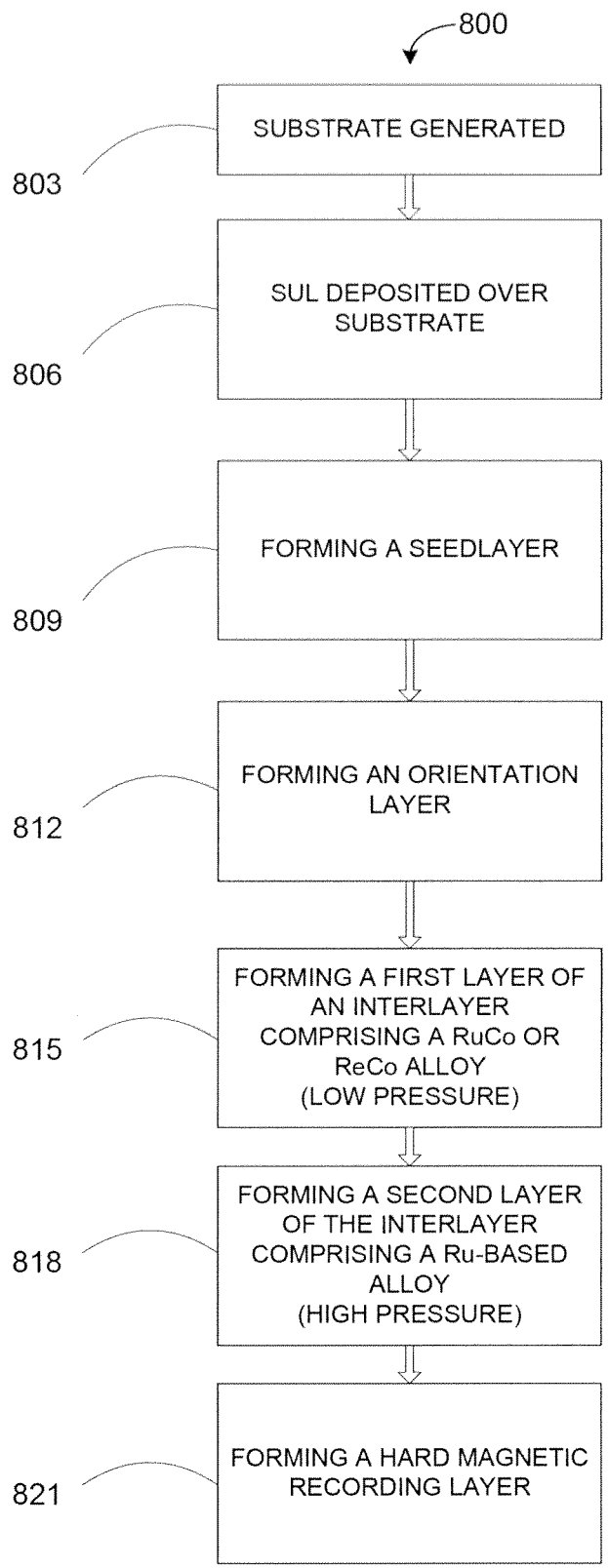
FIG. 8 is a flowchart illustrating an example method of manufacturing a recording media in accordance with an embodiment of the present invention.

FIG. 8 is a flowchart illustrating an example method of manufacturing a recording media in accordance with an embodiment of the present invention. The method 800 begins at operation 803, when a substrate is generated. The generation of a substrate for a magnetic recording disk is per se known in the art; accordingly a detailed discussion is not provided.

At operation 806, a (magnetic or non-magnetic) soft underlayer (SUL) is deposited over the substrate. Any conventional deposition method configured for the formation of the SUL may be utilized, such as sputter deposition (i.e., physical vapor deposition (PVD)). In some embodiments, an adhesion layer may also be deposited above the substrate before the SUL.

At operation 809, a seed layer is formed over the SUL. As discussed herein, the seed layer assists in the formation of the interlayer that eventually follows. Subsequently, at operation 812, an orientation layer is formed over the seed layer before the interlayer is formed.

At operation 815, a first layer of the interlayer comprising a RuCo or ReCo alloy is formed over the orientation layer using a low pressure sputter process. Operation 815 is followed by operation 818, where a second layer of the interlayer comprising a Ru-based alloy is formed over the first layer of the interlayer; the second layer of the interlayer is formed using a high pressure sputter process.

Method 800 continues with operation 821, where a hard magnetic recording layer is formed over the interlayer. Depending on the embodiment, the hard magnetic recording layer may comprise a FePt alloy or a CoPt alloy. For example, magnetic recording layer may comprise a FePt—X alloy or a CoPt—X alloy, where X comprises $Cr_2O_3$, $SiO_2$, $TiO_2$, $Al_2O_3$, $Ta_2O_5$, $ZrO_2$, $Nb_2O_5$, $V_2O_5$, MgO, MnO, $WO_3$, $HfO_2$, Ni, Cu, Ag, Mn, B, or C. In another example, magnetic recording layer may comprise a FePt:C or a FePt:oxide.

Figure 9:
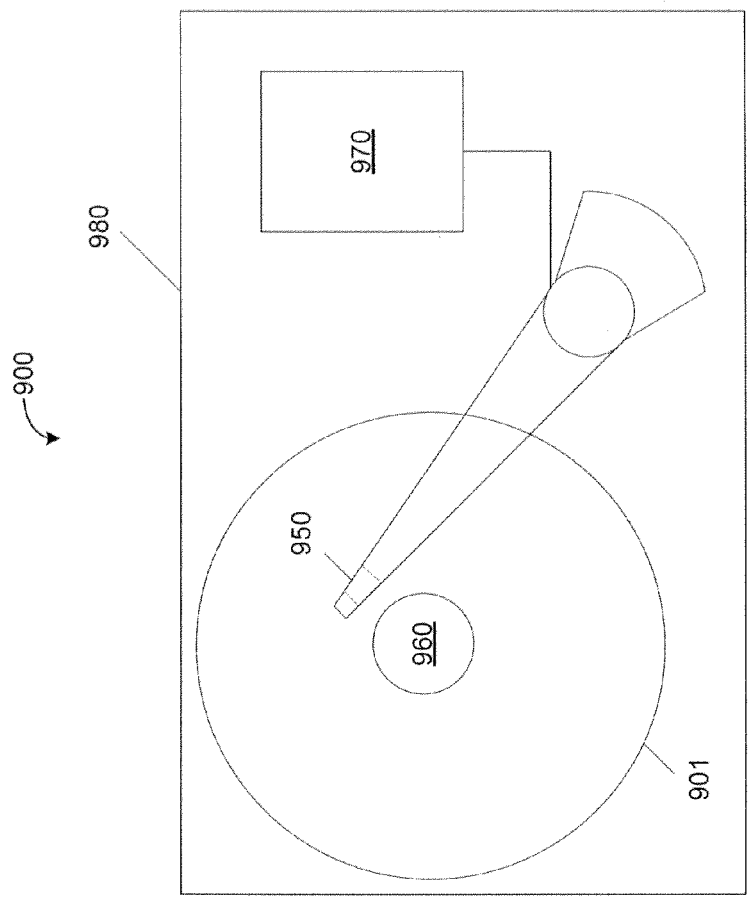
FIG. 9 illustrates a disk drive including a recording disk, in accordance with an embodiment of the present invention.

FIG. 9 illustrates a disk drive 900 having disk 901. Disk drive 900 may include one or more disks 900 to store data. Disk 901 resides on a spindle assembly 960 that is mounted to drive housing 980. Data may be stored along tracks in the magnetic recording layer of disk 901. The reading and writing of data is accomplished with head 950 that has both read and write elements. The write element is used to alter the properties of the perpendicular magnetic recording layer of disk 901. In one embodiment, head 950 may have magneto-resistive (MR), or giant magneto-resistive (GMR) elements. In an alternative embodiment, head 950 may be another type of head, for example, an inductive read/write head or a Hall effect head. In some embodiments, the disk 900 has one of the media structures depicted in FIG. 3, and the disk drive 900 is a perpendicular magnetic recording (PMR) drive. A spindle motor (not shown) rotates spindle assembly 960 and, thereby, disk 901 to position head 950 at a particular location along a desired disk track. The position of head 950 relative to disk 901 may be controlled by position control circuitry 970. The use of disk 901 fabricated in the manners discussed above may improve the performance of the perpendicular magnetic recording layer of disk 901.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. A recording medium comprising:
    a hard magnetic recording layer;
    an upper layer of an interlayer disposed under the hard magnetic recording layer, the upper layer comprising a Ru-based alloy; and
    a lower layer of the interlayer disposed under the upper layer, the lower layer comprising a ReCo alloy;
    wherein the lower layer of the interlayer comprises $Re_{100-x}$—$Co_x$, where X is between 20 and 60.

2. The recording medium of claim 1, further comprising an orientation control layer disposed under the lower layer of the interlayer.

3. The recording medium of claim 2, wherein the orientation control layer comprises a NiW alloy, a NiWAl alloy, or a NiWAlFe alloy.

4. The recording medium of claim 2, further comprising a seed layer disposed under the orientation control layer.

5. The recording medium of claim 1, wherein the lower layer of the interlayer has been deposited by way of a low-pressure sputtering process.

6. The recording medium of claim 5, wherein the lower layer of the interlayer has been deposited using Ar gas at a sputter pressure of approximately 1 to 20 mTorr.

7. The recording medium of claim 1, wherein the upper layer of the interlayer has been deposited by way of a high-pressure sputtering process.

8. The recording medium of claim 7, wherein the upper layer of the interlayer has been deposited using Ar gas at a sputter pressure of approximately 40 to 100 mTorr.

9. The recording medium of claim 1, wherein the recording medium is included in a recording device comprising a housing containing a recording head and the recording medium, the recording head for reading magnetic signals from, and writing magnetic signals to, the recording medium.

10. A method of manufacturing a recording medium, comprising:
    forming a first layer of an interlayer, the first layer comprising a ReCo alloy;
    forming a second layer of the interlayer over the first layer, the second layer comprising a Ru-based alloy; and forming a hard magnetic recording layer over the interlayer;

wherein the first layer of the interlayer comprises $Re_{100-X}$—$Co_X$, where X is between 20 and 60.

11. The method of claim 10, further comprising forming an orientation control layer before forming the first layer of the interlayer over the orientation control layer.

12. The method of claim 11, wherein the orientation control layer comprises a NiW alloy, a NiWAl alloy, or a NiWAlFe alloy.

13. The method of claim 11, further comprising forming a seed layer before forming the orientation control layer over the seed layer.

14. The method of claim 10, wherein forming the first layer of an interlayer comprises depositing the first layer using a low-pressure sputtering process.

15. The method of claim 14, wherein using the low-pressure sputtering process comprises using Ar gas at a sputter pressure of approximately 1 to 20 mTorr.

16. A method of manufacturing a recording medium, comprising:
    forming a first layer of an interlayer, the first layer comprising a ReCo alloy;
    forming a second layer of the interlayer over the first layer, the second layer comprising a Ru-based alloy; and
    forming a hard magnetic recording layer over the interlayer,
    wherein forming the second layer of the interlayer comprises depositing the second layer over the first layer of the interlayer using a high-pressure sputtering process,
    wherein using the high-pressure sputtering process comprises using Ar gas at a sputter pressure of approximately 40 to 100 mTorr.

* * * * *